(12) United States Patent
Singh

(10) Patent No.: US 6,232,606 B1
(45) Date of Patent: May 15, 2001

(54) FLAT PANEL DETECTOR FOR RADIATION IMAGING AND PIXEL FOR USE THEREIN

(75) Inventor: Surendra Pal Singh, Waterloo (CA)

(73) Assignee: Ifire Technology, Inc., Alberta (CA)

( * ) Notice: Subject to any disclaimer, the term of this patent is extended or adjusted under 35 U.S.C. 154(b) by 0 days.

(21) Appl. No.: 09/000,480

(22) PCT Filed: Jul. 31, 1995

(86) PCT No.: PCT/CA95/00456

§ 371 Date: Sep. 1, 1998

§ 102(e) Date: Sep. 1, 1998

(87) PCT Pub. No.: WO97/05658

PCT Pub. Date: Feb. 13, 1997

(51) Int. Cl.[7] ............................................. G01T 1/24
(52) U.S. Cl. ............................ 250/370.09; 250/370.01
(58) Field of Search .......................... 250/370.09, 370.01, 250/370.08, 370.14, 580; 257/448

(56) References Cited

U.S. PATENT DOCUMENTS

| | | |
|---|---|---|
| 5,184,018 | 2/1993 | Conrads et al. . |
| 5,381,014 | 1/1995 | Jeromin et al. . |
| 5,396,072 | 3/1995 | Schiebel . |

FOREIGN PATENT DOCUMENTS 0 574 690 A2    5/1993    (EP) .

OTHER PUBLICATIONS

Zhao and Rowlands; "Diontal Radiology Using Self–scanned Readant of Amorphous Selenium", SPIE vol. 1896 Physics of Medical Imaging, pp. 114–120 250/370.09, 1993.*

* cited by examiner

Primary Examiner—Seungsook Ham
Assistant Examiner—Richard Hanig
(74) Attorney, Agent, or Firm—Fay, Sharpe, Fagan, Minnich & McKee, LLP

(57) ABSTRACT

A flat panel detector for radiation imaging includes an array of pixels arranged in rows and columns. Gate lines interconnect the pixels of each row while source lines interconnect the pixels of each column. A radiation transducer is disposed over the pixel array. Each pixel includes a TFT switch having its gate electrode connected to a gate line and its source electrode connected to a terminal that is connectable to ground. The drain electrode of each TFT switch is connected to the pixel electrode of the pixel. The pixel electrode and a bottom electrode connected to a source line constitute a storage capacitor. When the TFT switch is biased and the pixel electrode is positively charged, the pixel electrode discharges through the TFT switch and onto the grounded terminal. This results in the release of negative charge held by the bottom electrode onto the source line, which is sensed by a charge amplifier connected to the source line.

15 Claims, 3 Drawing Sheets

FLAT PANEL DETECTOR FOR RADIATION IMAGING AND PIXEL FOR USE THEREIN

TECHNICAL FIELD

The present invention relates to imaging systems and in particular to a flat panel detector for radiation imaging and to a pixel for use in a flat panel detector.

BACKGROUND ART

Flat panel detectors for use in x-ray radiation imaging systems are known. Examples of these pixel sensor arrays can be found in U.S. Pat. Nos. 5,184,018 and 5,381,014. One such type of flat panel detector includes a thick amorphous selenium film (a-Se) on a two-dimensional TFT switch array. The TFT switches are arranged in rows and columns to form a two-dimensional imaging system. Gate lines interconnect the TFT switches in each row while source lines interconnect the TFT switches in each column. The thick selenium film is deposited directly on top of the TFT switch array and a top electrode is deposited on the selenium film.

When x-rays are incident on the selenium film and the top electrode is biased with a high voltage, electron-hole pairs are separated by the electric field across the thickness of the selenium film. The holes which are driven by the electric field move toward the pixel electrodes (i.e. the drain electrodes of the TFT switches) and accumulate. This results in a charge being held by the pixel electrodes which can be used to develop an x-ray image. The charge held by the pixel electrodes can be read by supplying a pulse to each gate line. When a gate line receives a pulse, the TFT switches in the row turn on, allowing the signal charges on the pixel electrodes to discharge through the TFT switches on to the source lines. Charge amplifiers connected to the source lines sense the charge and provide output voltage signals proportional to the charge and hence, proportional to the radiation exposure on the selenium film.

Although this pixel design is satisfactory, alternative designs are continually being sought. It is therefore an object of the present invention to provide a novel flat panel detector for radiation imaging and a pixel for use therein.

DISCLOSURE OF THE INVENTION

According to one aspect of the present invention there is provided a pixel for a radiation imaging flat panel detector comprising:

a radiation transducer to be exposed to incident radiation;

a pixel electrode on one side of said radiation transducer to accumulate a positive charge proportional to the exposure of said radiation transducer to radiation;

a second electrode separated from said pixel electrode by a dielectric and connected to a source line, said pixel and second electrodes constituting a storage capacitor, said second electrode developing a negative charge approximately equal to the magnitude of the positive charge accumulated by said pixel electrode; and a semiconductor switch coupled between said pixel electrode and a terminal connectable to ground, said semiconductor switch being responsive to a gating signal to connect electrically said pixel electrode to said terminal connectable to ground to discharge said pixel electrode thereon, said bottom electrode releasing said negative charge on said source line when said pixel electrode discharges to allow the charge to be detected.

According to another aspect of the present invention there is provided a flat panel detector for radiation imaging comprising:

a radiation transducer including a radiation conversion layer and an electrode on one side of said radiation conversion layer;

an array of pixels arranged in rows and columns on the other side of said radiation conversion layer;

a plurality of sources lines upon which charges accumulated by said pixels can be sensed, each of said source lines connecting the pixels in individual ones of one of said rows or columns of said array; and a plurality of gate lines upon which gating signals are supplied to allow accumulated charges to be sensed, each of said gate lines connecting the pixels in individual ones of the other of said rows or columns of said array, each of said pixels including: a pixel electrode to accumulate positive charge as a result of hole drift in said radiation conversion layer occurring upon exposure of said radiation transducer to radiation and when said electrode is biased; a second electrode separated from said pixel electrode by a dielectric and connected to one of said source lines, said pixel and second electrodes constituting a storage capacitor, said second electrode developing a negative charge approximately equal to the magnitude of the positive charge accumulated by said pixel electrode; and a semiconductor switch coupled between said pixel electrode and a terminal connectable to ground, said semiconductor switch being responsive to a gating signal to connect electrically said pixel electrode to said terminal connectable to ground to discharge said pixel electrode thereon, said bottom electrode releasing said negative charge on said source line when said pixel electrode discharges to allow the charge to be detected.

According to yet another aspect of the present invention there is provided a flat panel detector for radiation imaging comprising:

a radiation transducer including a radiation conversion layer and an electrode on one side of said radiation conversion layer;

an array of pixels arranged in rows and columns on the other side of said radiation conversion layer and formed on a common substrate;

a plurality of sources lines formed on said substrate and upon which charges accumulated by said pixels can be sensed, each of said source lines connecting the pixels in individual ones of one of said rows or columns of said array; and a plurality of gate lines formed on said substrate and upon which gating signals are supplied to allow accumulated charges to be sensed, each of said gate lines connecting the pixels in individual ones of the other of said rows or columns of said array, each of said pixels including: a thin film transistor switch having a drain electrode constituting a pixel electrode to accumulate positive charge as a result of hole drift in said radiation conversion layer occurring upon exposure of said radiation transducer to radiation and when said electrode is biased; a bottom electrode separated from said pixel electrode by a dielectric gate insulating layer and connected to one of said source lines, said pixel and bottom electrodes constituting a storage capacitor, said second electrode developing a negative charge approximately equal to the magnitude of the positive charge accumulated by said pixel electrode; and a source electrode coupled to a terminal connectable to ground, said thin film transistor switch being responsive to a gating signal to connect electrically said pixel electrode to said low terminal connectable to ground to discharge said pixel electrode thereon, said bottom electrode releasing said negative charge on said source line when said pixel electrode discharges to allow the charge to be detected.

According to still yet another aspect of the present invention there is provided a radiation imaging system including a radiation source and a flat panel detector, said flat panel detector comprising:

a radiation transducer including a radiation conversion layer and an electrode on one side of said radiation conversion layer;

an array of pixels arranged in rows and columns on the other side of said radiation conversion layer;

a plurality of sources lines upon which charges accumulated by said pixels can be sensed, each of said source lines connecting the pixels in individual ones of one of said rows or columns of said array;

a plurality of gate lines upon which gating signals are supplied to allow accumulated charges to be sensed, each of said gate lines connecting the pixels in individual ones of the other of said rows or columns of said array;

an array of charge amplifiers, each connected to one of said source lines to detect the charge thereon; and a gate driver to supply gating signal to said gate lines in succession to allow the charges accumulated by said pixels to be detected on a row-by-row basis, each of said pixels including: a pixel electrode to accumulate positive charge as a result of hole drift in said radiation conversion layer occurring upon exposure of said radiation transducer to radiation and when said electrode is biased; a second electrode separated from said pixel electrode by a dielectric and connected to one of said source lines, said pixel and second electrodes constituting a storage capacitor, said second electrode developing a negative charge approximately equal to the magnitude of the positive charge accumulated by said pixel electrode; and a semiconductor switch coupled between said pixel electrode and a terminal connectable to ground, said semiconductor switch being responsive to a gating signal to connect electrically said pixel electrode to said terminal connectable to ground to discharge said pixel electrode thereon, said bottom electrode releasing said negative charge on said source line when said pixel electrode discharges to allow the charge to be detected by said charge amplifier.

The present invention provides a relatively simple circuit design with minimal hardware components for detecting the exposure of a radiation transducer to radiation avoiding the need to discharge a capacitive transducer through a transistor to a charge amplifier. In addition, when two source lines are used with each pixel, the effects of noise on the source lines are significantly reduced.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1:
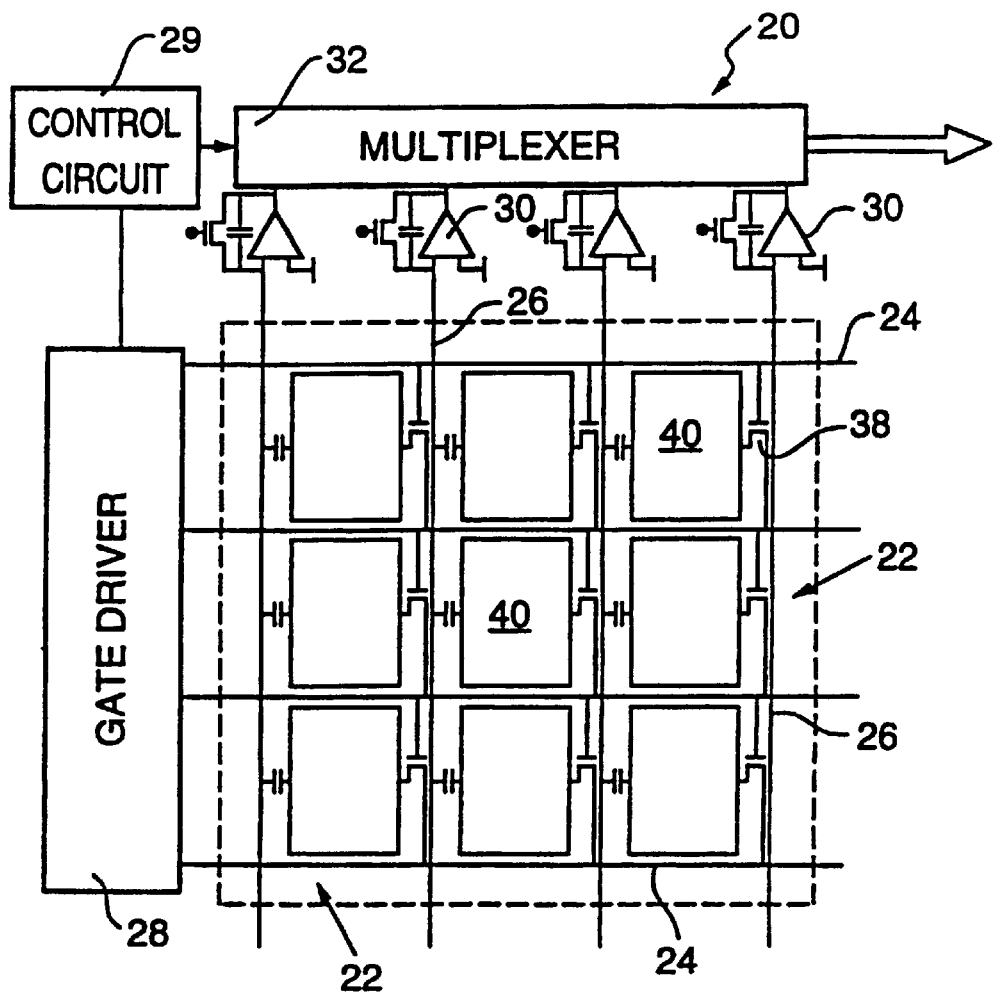
FIG. 1 is a schematic of a flat panel detector for radiation imaging in accordance with the present invention.

Referring now to FIG. 1, a flat panel detector for radiation imaging is shown and is generally indicated by reference numeral 20. The flat panel detector includes a plurality of pixels 22 arranged in rows and columns. Gate lines 24 formed of Chromium interconnect the pixels 22 of each row while source lines 26 interconnect the pixels 22 of each column. The gate lines 24 lead to a gate driver circuit 28 which provides pulses to the gate lines in succession in response to input from a control circuit 29. The source lines 26 lead to charge amplifiers 30 which in turn are connected to an analog multiplexer 32. The analog multiplexer provides image output which can be digitized to create a digitized radiation image in response to input from the control circuit 29.

Figure 2:
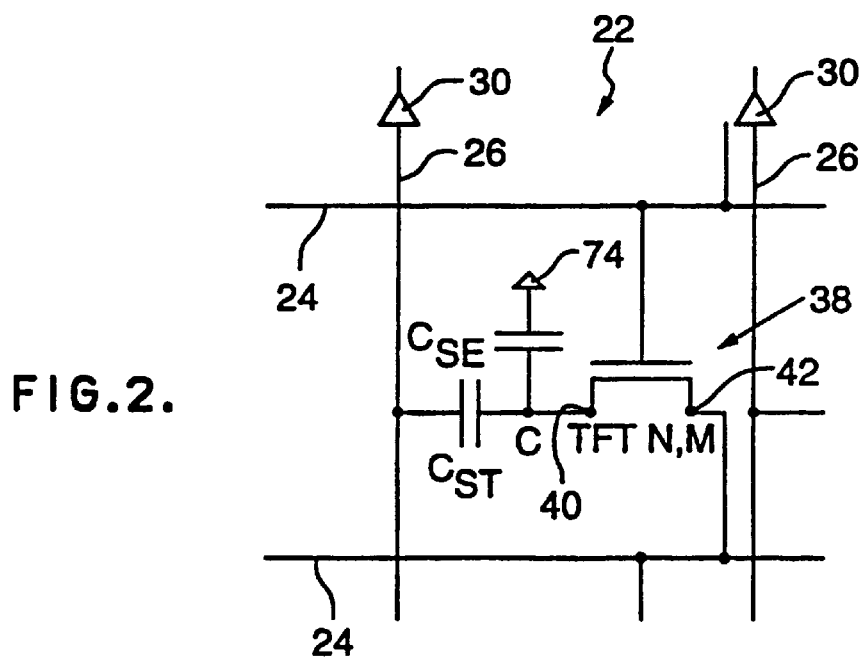
FIG. 2 is an equivalent circuit of a pixel forming part of the flat panel detector of FIG. 1.

FIG. 2 shows an equivalent circuit of one of the pixels 22. As can be seen, the pixel includes a radiation transducer $C_{SE}$ coupled to node C and to a high potential voltage source 74 in the order of 3 kV. A storage capacitor $C_{ST}$ is also coupled to node C as well as to source line 26. The drain electrode 40 of a thin film transistor ("TFT") switch 38 is also coupled to node C and defines the pixel electrode of pixel 22. The source electrode 42 of TFT switch 38 is coupled to one of the gate lines 24 while the gate electrode of the TFT switch 38 is coupled to another of the gate lines 24.

Figure 3:
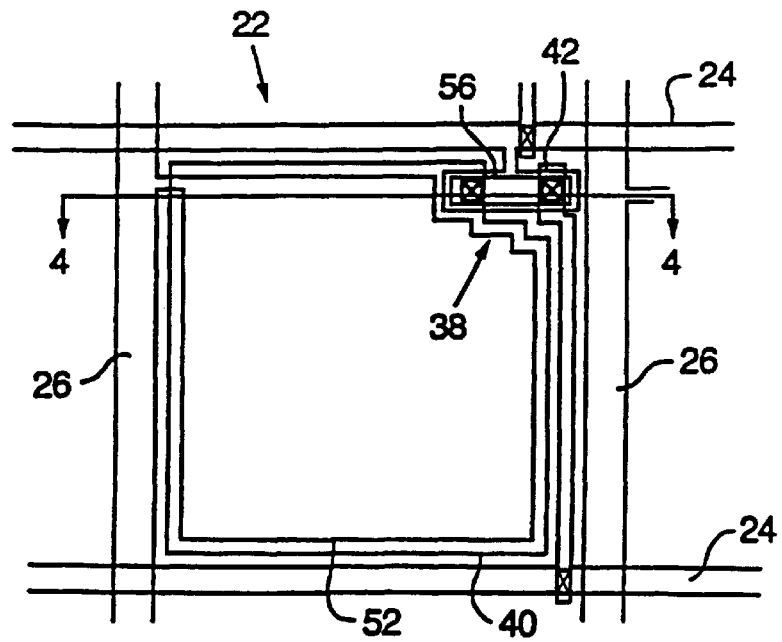
FIG. 3 is a top plan view of a pixel forming part of the flat panel detector of FIG. 1.
Figure 4:
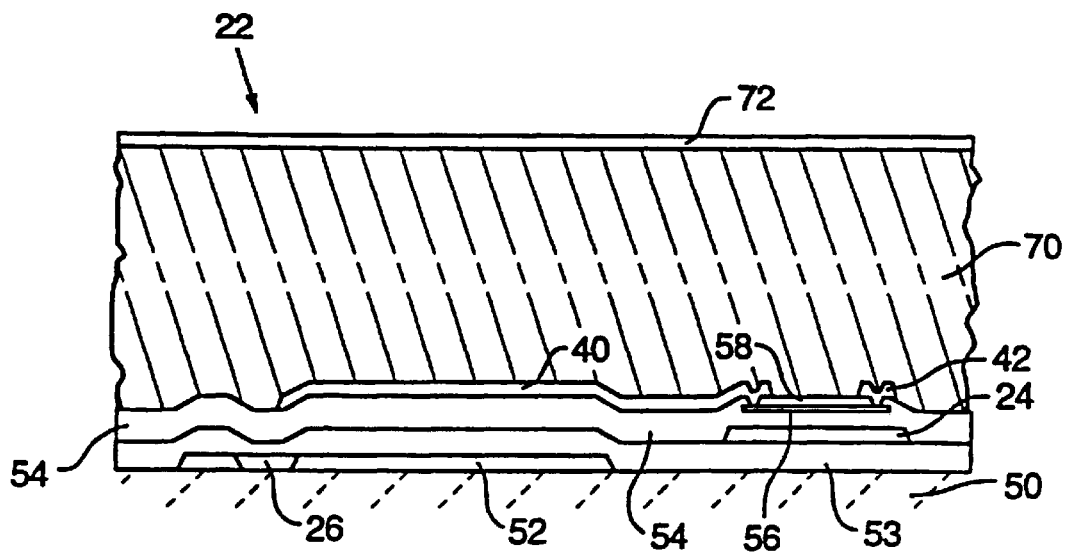
FIG. 4 is a cross-sectional view of the pixel of FIG. 3 taken along line 4—4.

Referring now to FIGS. 3 and 4, one of the pixels 22 formed in accordance with the present invention is better illustrated. A bottom electrode 52 is formed on a glass substrate 50 together with the source line 26 and is electrically connected to the source line 26. A dielectric layer 53 overlies the source line 26, bottom electrode 52 and substrate 50. The gate line 24 is deposited on dielectric layer 53 and is formed of Chromium. A gate insulating layer 54 formed of $SiO_2$ or $SiN_x$ overlies the gate line 24 and dielectric layer 53. Deposited on the gate insulating layer 54 above the gate line 24 is a semiconductor material layer formed of Cadmium Selenide (CdSe) defining the channel 56 of the TFT switch 38. Contacting the channel 56 are the drain and source electrodes 40 and 42 respectively of the TFT switch 38. A passivation layer 58 formed of $SiO_2$ or Si covers the portion of the channel 56 not covered by the drain and source electrodes.

Above the TFT switch array is the radiation transducer $C_{SE}$. The radiation transducer is in the form of a selenium (Se) radiation conversion layer 70 having a thickness of approximately 300 μm to 500 μm. Above the radiation conversion layer is a top electrode 72 formed of In, Al or Au. The top electrode 72 is coupled to a high potential voltage source 74 to provide the necessary bias to the radiation transducer $C_{SE}$. The top electrode 72 and the drain electrode 40 form the electrodes of radiation transducer $C_{SE}$ while the drain electrode 40 and bottom electrode 52 form the electrodes of storage capacitor $C_{ST}$.

Although only one pixel 22 is shown, it should be realized that each of the pixels 22 in the array are identical and that the pixels are formed on the substrate 50 simultaneously by depositing appropriate layers on the substrate and etching them as required.

In operation, the top electrode 72 is biased to a high potential by voltage source 74 and the flat panel detector 20 is exposed to radiation, resulting in an electric field being created in the radiation conversion layer 70 which causes electrons to move towards the top electrode 72 and holes to move towards the drain or pixel electrodes 40. The majority of the holes drift to the drain electrodes where positive charges are accumulated.

While the flat panel detector 20 is being exposed to radiation, the gate lines 24 are suitably maintained to keep the TFT switches 38 in an off-state. With the TFT switches off, as the drain electrodes 40 accumulate positive charges, negative charges are pulled on to the bottom electrodes 52 from the charge amplifiers 30 via the source lines 26 so that equal and opposite charges appear at the electrodes 40 and 52 constituting the storage capacitors $C_{ST}$.

After the flat panel detector 20 has been exposed to radiation and it is desired to create an image, a bias is applied to each gate line 24 in succession by the gate driver 28 in response to input from the control circuit 29. When a bias is applied to a gate line 24, all of the TFT switches 38 connected to that gate line turn on. This allows the charges held by the bottom electrodes 52 of those pixels to be sensed by the charge amplifiers 30 connected to the source lines 26 extending to those pixels 22. Thus, by biasing the gate lines 24 in succession, a radiation image can be created on a row-by-row basis. The manner in which the charge held by bottom electrodes 52 is sensed will now be described with reference to a single pixel 22.

When the bias is applied to the gate line 24, the TFT switch 38 is conditioned to an on-state. With the TFT switch on, the drain electrode 40 is electrically coupled to the source electrode 42 and hence, to the gate line 24 associated with another row of pixels 22 through the TFT switch 38. At this stage, the other gate line 24 is grounded and therefore, is at a low potential.

When this occurs, the charge held by the drain electrode 40 is discharged through the TFT switch 38 on to the gate line 24 at ground. As this occurs, the negative charge on the bottom electrode 52 pulled from the charge amplifier 30 via source line 26 is released. This change in charge on the source line 26 is sensed by the charge amplifier 30. Since the charge on the bottom electrode 52 is proportional to the exposure of the radiation transducer $C_{SE}$ to radiation, the change in charge sensed by the charge amplifier 30 is also proportional to the exposure of the radiation transducer to radiation. The charge amplifier 30 in turn generates output representative of the exposure of the radiation transducer $C_{SE}$ to radiation and conveys the output to the analog multiplexer 32.

Figure 5:
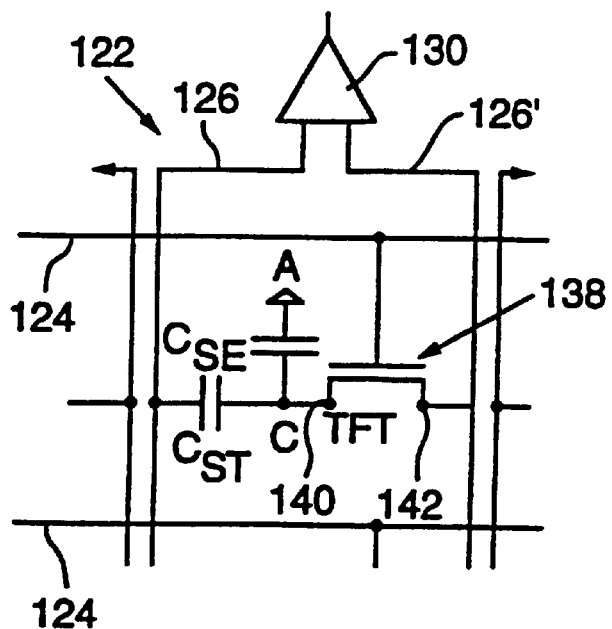
FIG. 5 is an equivalent circuit of an alternative embodiment of a pixel for a flat panel detector for radiation imaging.

Referring now to FIG. 5, another embodiment of a pixel for use in a flat panel detector for radiation imaging is shown and is generally indicated by reference numeral 122. The pixel 122 is very similar to that shown in the previous embodiment with the exception that the source electrode 142 of TFT switch 138 is connected to a second source line 126', rather than to the gate line 124. In this embodiment, the source lines 126 and 126' associated with the pixel 122 lead to a balanced charge amplifier 130. Because each pixel has two source lines, noise contributed by one source line 126 cancels the noise contributed by the other source line 126' reducing the overall effect of noise. Also, the use of two source lines helps to reduce the contribution of even harmonics generated by the TFT switch 138 as well as to reduce the effects of odd harmonics.

During operation of the pixel 122, after the flat panel detector has been exposed to radiation and the bottom electrode is charged, when the bias is applied to the gate line 124, the charge held by the drain electrode 140 is discharged through TFT switch 138 on to source line 126' where it is sensed by charge amplifier 130. At the same time, the charge on the bottom electrode 52 is released. The resulting change in charge on the source line 126 is also sensed by the charge amplifier 130. The balanced charge amplifier 130 detects the input from the source lines 126 and 126' and generates an output voltage proportional to the exposure of the pixel 122 to radiation.

Figure 6:
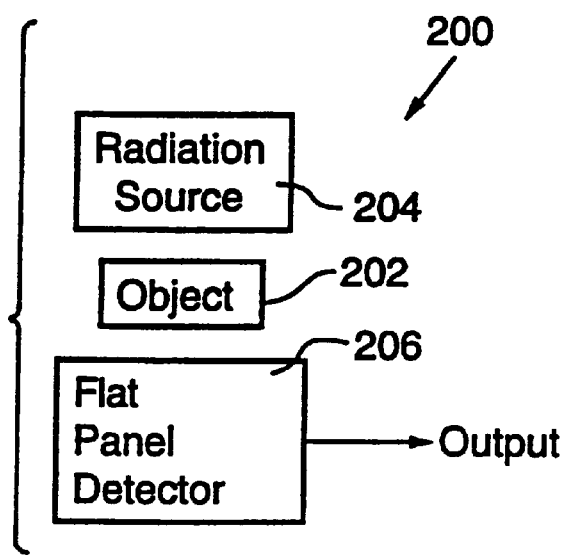
FIG. 6 is a schematic of a radiation imaging system incorporating a flat panel detector.

FIG. 6 shows an x-ray imaging system 200 for taking a radiation image of an object 202. The x-ray imaging system 200 includes a radiation source 204 and a flat panel detector 206. The flat panel detector can include pixels of the type shown in FIG. 2 or 5. As can be seen, when an x-ray image of an object is to be taken, the object 202 is placed between the radiation source 204 and the flat panel detector 206 and the object is exposed to x-ray radiation. X-ray radiation passing through the object 204 contacts the flat panel detector 206 allowing for an image of the object to be taken in the manner described previously.

As should be appreciated by those of skill in the art, the present invention allows charges accumulated by the pixel electrodes to be sensed without discharging the charge through TFT switches to the charge amplifiers. Also, when two source lines are used in each pixel, electronic noise is reduced. Although reference has been made to specific materials forming the various components of the pixels, those of skill in the art will appreciate that other suitable materials can be used. Those of skill in the art will also appreciate that variations and modifications may be made to the present invention without departing from the scope thereof as defined by the appended claims.

What is claimed is:

1. A pixel for a radiation imaging flat panel detector comprising:

a radiation transducer to be exposed to incident radiation;

a pixel electrode on one side of said radiation transducer to accumulate a positive charge generally proportional to the exposure of said radiation transducer to radiation;

a second electrode separated from said pixel electrode by a dielectric and connected to a source line, said pixel and second electrodes constituting a storage capacitor, said second electrode developing a negative charge approximately equal to the magnitude of the positive charge accumulated by said pixel electrode; and a semiconductor switch coupled between said pixel electrode and a terminal connectable to ground, said semiconductor switch being responsive to a gating signal to connect electrically said pixel electrode to said terminal when said terminal is connected to ground to discharge said pixel electrode thereon, said second electrode releasing said negative charge on said source line when said pixel electrode discharges to allow the charge to be detected.

2. A pixel as defined in claim 1 wherein said semiconductor switch is in the form of a thin film transistor having a drain terminal connected to said pixel electrode, a gate terminal connected to a gate line and being responsive to said gating signal, and a source terminal connected to said terminal connectable to ground.

3. A pixel as defined in claim 2 further comprising a charge amplifier connected to said source line for detecting the release of said negative charge.

4. A pixel as defined in claim 3 wherein said source terminal is connected to a second source line, said second source line also being connected to said charge amplifier.

5. A pixel as defined in claim 2 wherein said source terminal is connected to a second gate line.

6. A flat panel detector for radiation imaging comprising:
- a radiation transducer including a radiation conversion layer and an electrode on one side of said radiation conversion layer;
- an array of pixels arranged in rows and columns on the other side of said radiation conversion layer;
- a plurality of source lines upon which charges accumulated by said pixels can be sensed, each of said source lines connecting the pixels in an individual column of said array; and
- a plurality of gate lines upon which gating signals are supplied to allow accumulated charges to be sensed, each of said gate lines connecting the pixels in an individual row of said array, each of said pixels including:
  - a pixel electrode to accumulate positive charge as a result of hole drift in said radiation conversion layer occurring upon exposure of said radiation transducer to radiation and when said electrode is biased;
  - a second electrode separated from said pixel electrode by a dielectric and connected to one of said source lines, said pixel and second electrodes constituting a storage capacitor, said second electrode developing a negative charge approximately equal to the magnitude of the positive charge accumulated by said pixel electrode; and
  - a semiconductor switch coupled between said pixel electrode and a terminal connectable to ground, said semiconductor switch being responsive to a gating signal to connect electrically said pixel electrode to said terminal when said terminal is connected to ground to discharge said pixel electrode thereon, said second electrode releasing said negative charge on said source line when said pixel electrode discharges to allow the charge to be detected.

7. A flat panel detector as defined in claim 6 wherein said semiconductor switches are in the form of thin film transistors and wherein said pixels and gate and source lines are formed on a common substrate.

8. A flat panel detector as defined in claim 7 wherein said terminal connectable to ground is a gate line interconnecting the pixels of a different row.

9. A flat panel detector as defined in claim 7 further including an array of charge amplifiers, each connected to one of said source lines to detect the charge thereon.

10. A flat panel detector as defined in claim 9 further including a gate driver to supply gating signal to said gate lines to allow the charges accumulated by said pixels to be detected on a row-by-row basis.

11. A flat panel detector as defined in claim 7 wherein said terminal connectable to ground is a second source line associated with said pixel, said charge being detected by sensing both source lines.

12. A flat panel detector as defined in claim 11 further including an array of charge amplifiers, each connected to both of the source lines interconnecting an individual column of said array to detect the charges thereon.

13. A radiation imaging system including a radiation source and a flat panel detector, said flat panel detector comprising:
- a radiation transducer including a radiation conversion layer and an electrode on one side of said radiation conversion layer;
- an array of pixels arranged in rows and columns on the other side of said radiation conversion layer;
- a plurality of sources lines upon which charges accumulated by said pixels can be sensed, each of said source lines connecting-the pixels in an individual column of said array;
- a plurality of gate lines upon which gating signals are supplied to allow accumulated charges to be sensed, each of said gate lines connecting the pixels in an individual row of said array;
- an array of charge amplifiers, each connected to one of said source lines to detect the charge thereon; and
- a gate driver to supply gating signal to said gate lines in succession to allow the charges accumulated by said pixels to be detected on a row-by-row basis, each of said pixels including:
  - a pixel electrode to accumulate positive charge as a result of hole drift in said radiation conversion layer occurring upon exposure of said radiation transducer to radiation and when said electrode is biased;
  - a second electrode separated from said pixel electrode by a dielectric and connected to one of said source lines, said pixel and second electrodes constituting a storage capacitor, said second electrode developing a negative charge approximately equal to the magnitude of the positive charge accumulated by said pixel electrode; and
  - a semiconductor switch coupled between said pixel electrode and a terminal connectable to ground, said semiconductor switch being responsive to a gating signal to connect electrically said pixel electrode to said terminal when said terminal is connected to ground to discharge said pixel electrode thereon, said second electrode releasing said negative charge on said source line when said pixel electrode discharges to allow the charge to be detected by said charge amplifier.

14. A radiation imaging system as defined in claim 13 wherein said terminal connectable to ground is a gate line interconnecting the pixels of a different row.

15. A radiation imaging system as defined in claim 14 wherein said semiconductor switches are thin film transistors.

* * * * *